United States Patent [19]
Keim et al.

[11] Patent Number: 5,176,811
[45] Date of Patent: Jan. 5, 1993

[54] GOLD PLATING BATH ADDITIVES FOR COPPER CIRCUITIZATION ON POLYIMIDE PRINTED CIRCUIT BOARDS

[75] Inventors: Leann G. Keim, Endicott; Ralph S. Paonessa, Endwell; Daniel C. Van Hart, Conklin, all of N.Y.

[73] Assignee: International Business Machines Corporation, Armonk, N.Y.

[21] Appl. No.: 649,514

[22] Filed: Feb. 1, 1991

[51] Int. Cl.⁵ .................. C25D 3/48; C25D 5/54; C25D 7/12
[52] U.S. Cl. .................. 205/164; 205/266; 205/926; 205/920
[58] Field of Search .......... 204/47.5, 45.1, 38.7, 204/20, 22; 205/266, 926, 920, 158, 164

[56] References Cited

U.S. PATENT DOCUMENTS

| | | | |
|---|---|---|---|
| 3,880,730 | 4/1975 | Wright et al. | 204/47.5 |
| 4,962,004 | 10/1990 | Shyu | 428/626 |
| 5,015,538 | 5/1991 | Krause et al. | 204/38.4 |
| 5,032,467 | 7/1991 | Krause et al. | 204/38.4 |

OTHER PUBLICATIONS

Principles of Electronic Packaging–"Polymers and Polymer-Based Composites for Electronic Applications" Appelt et al.; pp. 334–371.
Principles of Electronic Packaging–"Joining Materials and Processes in Electronic Packaging" Senger et al.; pp. 577–619.
Microelectronics Packaging Handbook–"Printed-Circuit Board Packaging" D. P. Seraphim et al.; pp. 853–921.
Microelectronics Packaging Handbook–"Chip-To-Package Interconnections", N. G. Koopman et al.; pp. 361–453.

Primary Examiner—John Niebling
Assistant Examiner—Brian M. Bolam
Attorney, Agent, or Firm—Richard M. Goldman

[57] ABSTRACT

Disclosed is a method of fabricating a microelectronic package, especially a microelectronic package having gold plated copper circuitization on a polyimide substrate. The method includes the steps of forming a pattern of copper circuitization on the selected portions of the polyimide substrate, and thereafter depositing a gold thin film of selected portions of the copper circuitization layer. The gold thin film is electrodeposited from an electrodeposition solution of $KAu(CN)_2$, $K_2HPO_4$, and $KH_2PO_4$, modified by the addition of an effective amount of $NH_4^-$.

11 Claims, 2 Drawing Sheets

GOLD PLATING BATH ADDITIVES FOR COPPER CIRCUITIZATION ON POLYIMIDE PRINTED CIRCUIT BOARDS

FIELD OF THE INVENTION

The invention relates to the fabrication of microelectronic circuit packages. More particularly the invention relates to microelectronic circuit packages having polymeric layers, as polyimide layers, with circuitization applied thereto. Generally, the circuitization is multilayer, with a chromium adhesion layer sputtered onto the polymer, a copper "seed" layer deposited onto the chromium adhesion layer, and the copper circuitization atop the copper "seed" layer. In the case of solder joints and thermal compression bonds, for example with IC chips or surface mount devices, the copper circuitization carries a thin gold film.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

Packages may be characterized by the material used as the dielectric, i.e., as ceramic packages or as polymeric packages. The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334-371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853-922, also previously incorporated herein by reference.

In the normal process for package fabrication a fibrous body, such as a non-woven mat or woven web, is impregnated with a resin. This step includes coating the fibrous body with an A- stage resin solution, evaporating the solvents associated with the resin, and partially curing the resin. The partially cured resin is called a B-stage resin. The body of fibrous material and B stage resin is called a prepreg. The prepreg, which is easily handled and stable, may be cut into sheets for subsequent processing.

Typical resins used to form the prepreg include epoxy resins, cyanate ester resins, polyimides, hydrocarbon based resins, and fluoropolymers.

For example, cyanate ester resins also used in forming prepregs. One type of cyanate ester resin includes dicyanates mixed with methylene dianiline bis-maleimide. This product may be further blended with compatible epoxides to yield a laminate material. One such laminate material is a 50:45:5 (parts by weight) of epoxy: cyanate: maleimide. Typical of cyanate ester resins useful in forming prepregs is the product of bisphenol-A dicyanate and epoxy, which polymerizes during lamination to form a crosslinked structure.

A still further class of materials useful in forming prepregs for rigid multilayer boards are thermosetting polyimides. While thermosetting polyimides exhibit high water absorption, and high cost, they have good thermal properties and desirable mechanical properties. The preferred polyimides for prepreg use are addition products such as polyimides based on low molecular weight bis-maleimides.

A closely related alternative package is flexible film packaging, also known as flex packaging. Flex packaging is described by Donald P. Seraphim, Donald E. Barr, William T. Chen, George P. Schmitt, and Rao R. Tummala, *Printed Circuit Board Packaging*, at pages 853-921, and especially pages 870-872 of R.R. Tummala and E. J. Rymaszewski, *Microelectronics Packaging Handbook*, previously incorporated herein by reference.

Flexible film packages are generally similar to prepreg based circuit packages, however they are thinner then pre-preg based printed circuit boards, and are fabricated from polyimide or polyester rather than epoxy - glass fiber.

Surface circuitization of flex packages is accomplished by bonding copper foil with a suitable adhesive, as epoxy or acrylic, and photolithographically patterning the copper into circuit leads.

Subsequent processing of polymeric substrates includes circuitization, that is, the formation of a Cu signal pattern or power pattern on the prepreg or flex, or lamination of the prepreg to a power core. Circuitization may be additive or subtractive.

In the case of additive circuitization a thin film of an adhesion layer, such as a thin film of chromium, is first applied to the prepreg. The adhesion layer may be applied by sputtering. Typically, the film of adhesion metal is from about 500 Angstroms to about 2000 Angstroms. Thicker layers of chromium result in internal streses, while thinner layers may be non-continuous.

Thereafter a "seed" layer of copper is applied atop the adhesion layer. This copper layer is from about 3000 Angstroms thick to about 25,000 Angstroms (2.5 microns) thick. It may be applied by sputtering, electrodeposition, or electroless deposition.

Subsequently, photoresist is applied atop the copper "seed" layer, imaged, and developed to provide a pattern for circuit deposition. Copper circuitization is then plated onto the "seed" layer to provide the circuitization pattern on the surface of the package. The remaining photoresist is then stripped, leaving a thick copper plated circuitization pattern and a thin multilayer "background" of a "seed" copper- chromium adhesion layer.

The "seed" copper can be etched by various methods well known in the art. The chromium adhesion layer is removed, for example, by etching with, for example, permanganate etches and/or chloride etches. However, these etchants require careful cleaning steps to removed permanganate or chloride entrapped within crevices. Permanganate and hydrochloric acid so entrapped and/or entrained can result in loss of adhesion long after fabrication. This is especially so in the case of subsequent application of gold thin films atop the copper circuitization. The resulting circuitized prepreg is called a core.

The composite printed circuit package is fabricated by interleaving cores (including signal cores, signal/signal cores, power cores, power/power cores, and signal/power cores) with additional sheets of prepreg, and surface circuitization. Holes, as vias and through holes, may be drilled in individual core structures, for example, before or after circuitization, as described above, or in partially laminated modules.

An alternative package is Tape Automated Bonding (TAB). The TAB structure and process is described by Nicholas G. Koopman, Timothy C. Reiley, and Paul C. Totta, *Chip To Package Interconnections*, at pages 361-453, and especially pages 409-437 of R.R. Tummala and E. J. Rymaszewski, *Microelectronics Packaging Handbook*, previously incorporated herein by reference, and Charles G. Woychik and Richard C. Senger, *Joining Materials and Processes in Electronic Packaging*, at pages 577-619, and especially pages 580-583 of Donald P. Seraphim, Ronald Lasky, and Che-Yu Li, *Principles of Electronic Packaging*, previously incorporated herein by reference.

The TAB process involves bonding an IC chip to patterned metal on a polymer tape. Typically the polymer tape is a polyimide tape, although it may be polyester or poly perfluorocarbon, and the patterned metal is copper, for example a patterned copper film about 20 to about 40 microns thick. Adhesion of the copper to the polymer is obtained by plating the copper onto a multilayer of sputtered chromium and copper layers, each about 1 micron thick. This Cr-Cu multilayer provides a plating base for the Cu circuitization. The Cu circuitization is applied by vapor deposition or sputtering, and photolithographically patterned. Cu circuitization feature size is on the order of 50 microns.

An alternative TAB structure is formed by the spray deposition of polyimide. Thereafter the copper and the polyimide are patterned by etching with suitable etchants.

Bonding of the IC chip to the TAB copper leads is typically by thermal compression bonding or gold-tin liquid phase bonding to peripheral interconnections of the active device. The outer pads are soldered to the next level of packaging.

The surface circuitization is the power and signal interface between the package and the integrated circuit chips. Various methods are used to provide the bond between the integrated circuit chip leads and the surface circuitization. One method is the provision of gold surfaces, as thin film deposits and as "bumps", on the surface circuitization. These gold surfaces on selected regions of the copper circuitization can be utilized as solder pads, or as sites for thermal compression bonding.

The gold surfaces are typically "high purity" gold, also referred to as "soft" gold. High purity or soft gold is typically electroplated atop the copper surface circuitization from an electroplating solution having the composition shown in Table 1.

TABLE 1

| Typical Gold Electroplating Bath Formulation | |
|---|---|
| Component | Concentration |
| $KAu(CN)_2$ | 20 g/L |
| $K_2HPO_4$ | 40 g/L |
| $KH_2PO_4$ | 10 g/L |
| pH | 7.0-7.5 |

When the composition shown in Table 1 is used for electroplating a gold thin film onto copper surface circuitization on polyimide, as the polymeric reaction product of pyromellitic dianhydride and oxydianiline, there is a loss of adhesion between the copper circuitization and the polymeric substrate.

It is believed that this loss of adhesion arises because of electrochemical reactions in the polyimide during electrodeposition of the gold. The adhesion loss begins at the edge of the copper-polyimide interface and moves in toward the center of the copper-polyimide interface. The more severe the adhesion damage, the wider the area of edge adhesion loss will be. This adhesion loss is undesirable because it reduces the reliability of the circuitry.

OBJECTS OF THE INVENTION

It is one object of the invention to provide high density cards and boards having copper surface circuitization on a polyimide substrate.

It is another object of the invention to provide high density cards and boards having copper surface circuitization on the polyimide substrate, with thin film gold regions, e.g. for bonding pads, on the copper circuitization.

It is still a further object of the invention to plate the gold onto the copper circuitization while reducing the adhesion loss of the copper circuitization to the polyimide substrate.

SUMMARY OF THE INVENTION

These and other objects are obtained by the microelectronic circuit package fabrication method of the invention. The fabrication method is useful for fabricating a microelectronic package having gold plated copper surface circuitization.

The fabrication method includes circuitization of a polymeric substrate, as a polyimide substrate, with copper circuitization, and subsequent selective gold plating of the copper circuitization with a modified plating solution. The plating solution is modified by the addition thereto of ammonium ion, such as ammonium halide The addition of ammonium salts, as $NH_4Cl$, $NH_4Br$, $NH_4I$, or $NH_4X$ where X is a non-interfering anion, reduces the extent of edge adhesion loss. X can be a halide, sulfate, phosphate, carboxylate, or the like.

According to the method of the invention the copper circuitization is formed on the dielectric substrate, and thereafter gold is electrodeposited on the copper circuitization from an electroplating solution. The electroplating solution contains $KAu(CN)_2$, $K_2HPO_4$, and $KH_2PO_4$, modified by the addition of an effective amount of ammonium ion to reduce adhesion loss between the copper circuitization and the substrate.

The problem of loss of adhesion occurs when the substrate is a polyimide substrate, such as poly (pyromellitic dianhydride-oxydianiline). The $NH^-_4$ ion is believed to suppress certain reactions between the polyimide substrate and the copper circuitization.

The concentration of $NH^-_4$ is high enough to reduce or even prevent the reactions between the Cu and the polyimide. This is a $NH^-_4$ concentration of at least about 0.1 equivalent of $NH_4^-$ per liter. Generally, the concentration of ammonium ion is from about 0.1 equivalent per liter to about 1.0 equivalent per liter.

THE FIGURES

The invention must be understood by reference to the Figures.

FIG. 3 is a plot of adhesion loss versus $NH_4^-$ in the plating bath.

DETAILED DESCRIPTION OF THE INVENTION

Figure 1:
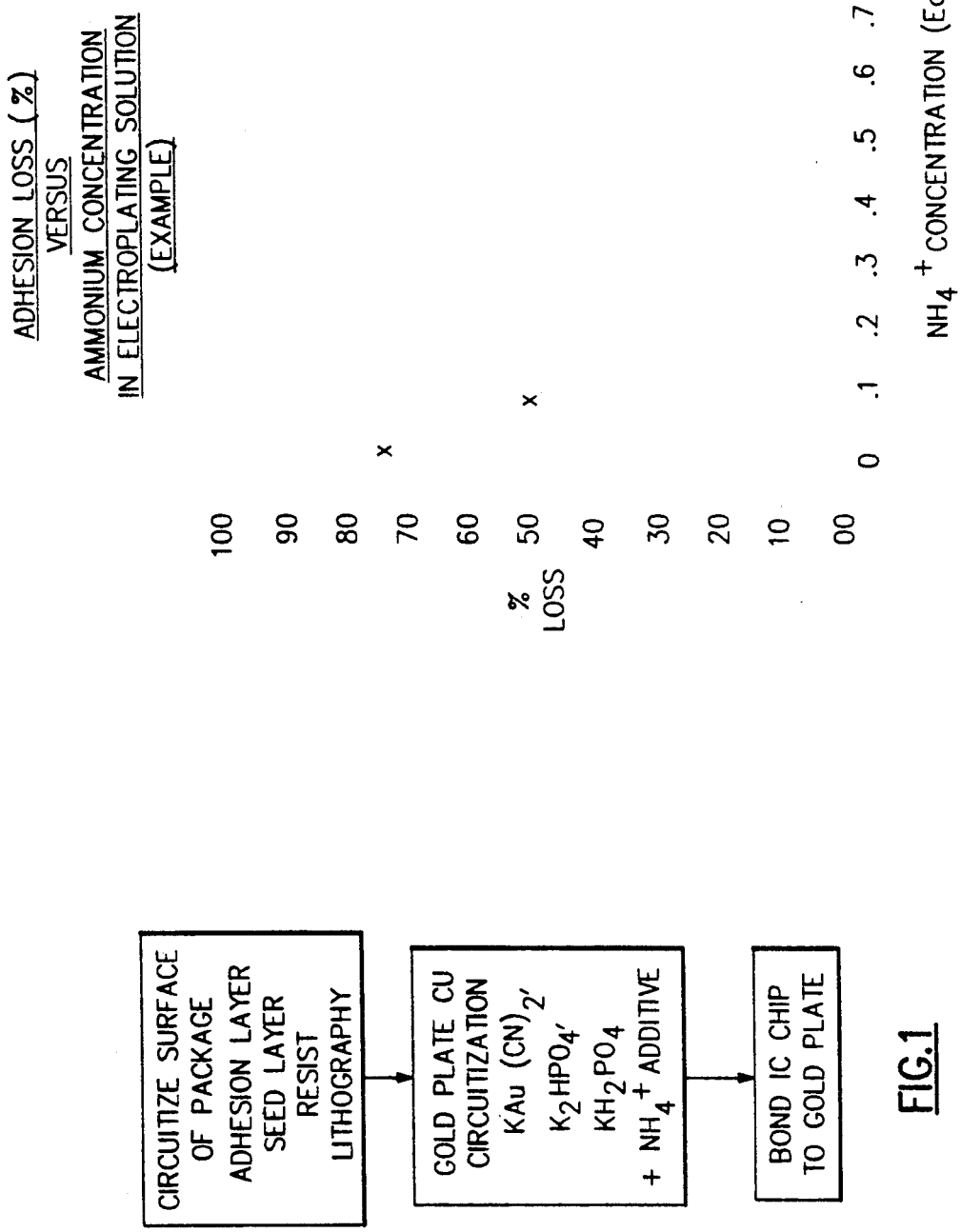
FIG. 1 is a flow chart of the method of the invention.

The method of the invention is illustrated in the flow chart of FIG. 1. FIG. 1 illustrates a flow chart of a microelectronic circuit package fabrication method useful for fabricating a microelectronic package.

According to the method disclosed herein a microelectronic circuit package is fabricated having selectively gold plated copper circuitization on a dielectric substrate.

The fabrication method includes circuitization of a polymeric substrate, as a polyimide substrate, with copper circuitization, as shown in the first block of the flow chart. It is to be understood that this "circuitization" step may include application of an adhesion layer, for example chromium, and subsequent application of a Cu seed layer. It is also to be understood that the circuitization can be additive or subtractive, and that the adhesion and seed layers are normally removed from uncircuitized areas of the microelectronic circuit package.

The second block of the flow chart shows the subsequent selective gold plating of the copper circuitization. The plated regions correspond, for example to bumps, pads, leads, contacts, and the like. Gold plating is carried out with a modified electroplating solution. The electroplating solution is modified by the addition of ammonium ion, such as ammonium halide. The addition of ammonium salts, as $NH_4Cl$, $NH_4Br$, $NH_4I$, or other non-interfering anions reduces the extent of edge adhesion loss.

The electroplating solution contains $KAu(CN)_2$, $K_2HPO_4$, and $KH_2PO_4$, modified by the addition of an effective amount of ammonium ion to reduce adhesion loss between the copper circuitization and the substrate. The concentration of ammonium ion is an effective amount to suppress loss of adhesion, which is generally at least about 0.1 equivalent of $NH_4^-$ per liter, and preferably from about 0.1 equivalent per liter to about 1.0 equivalent per liter.

The problem of loss of adhesion occurs when the substrate is a polyimide substrate, such as poly (pyromellitic dianhydride-oxydianiline). The $NH^-_4$ ion is believed to suppress certain reactions between the polyimide substrate and the copper circuitization.

Figure 2:
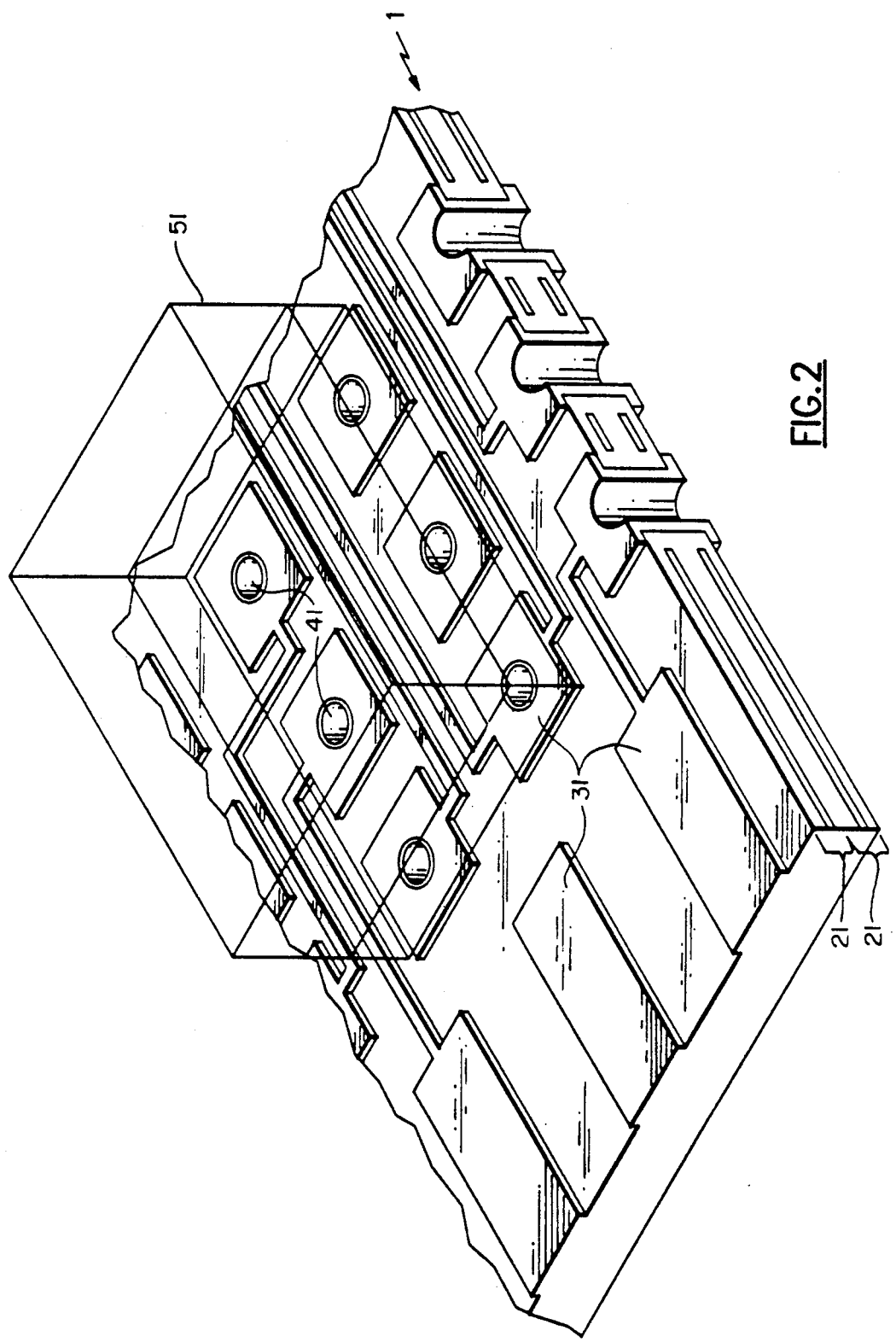
FIG. 2 is a partial cutaway view of a microelectronic circuit package produced according to the method of the invention.

A microelectronic circuit package prepared by a method of the invention is shown in FIG. 2 The circuit package 1 includes a pair of polymeric layers 21. The polymeric layers carry surface circuitization 31 including through holes 41 and at least one integrated circuit chip 51.

The method of the invention may be further understood by reference to the example below.

EXAMPLE

A series of gold electroplating solutions were prepared and used to plate gold thin films on to 200 micron Cu lines on poly (pyromellitic dianhydride- oxydianiline) substrates.

Two methods of accelerated testing may be used. One is exposure to 80 degrees Centigrade, 80 percent relative humidity air for twenty four hours. The other is immersion in boiling water for ten minutes. Both accelerated test methods yield consistent results.

The results are shown in Table 2 and FIG. 3.

TABLE 2

| Gold Electroplating Bath Formulations | | |
|---|---|---|
| Component | Concentration | Adhesion Loss |
| $KAu(CN)_2$ | 20 g/L | |
| $K_2HPO_4$ | 40 g/L | |
| $KH_2PO_4$ | 10 g/L | |
| pH | 7.0–7.5 | |
| $NH_4Cl$ | none | 73 microns |
| $NH_4Cl$ | 0.1 m/L | 50 microns |
| $NH_4Cl$ | 1.0 m/L | 31 microns |

It can be seen from Table 2, above, that a significant reduction in adhesion loss is obtained by the inclusion of $NH^+_4$ in the electroplating. In the case of a 1 Equivalent/Liter addition of $NH_4Cl$ to the electroplating solution, a fifty eight percent in edge adhesion loss was observed. For example, in the case of a 200 micron line, after accelerated testing by immersion in boiling water for ten minutes, there is a 73 percent adhesion loss in the absence of the additive, but only a 31 percent adhesion loss with the additive.

According to the method of the invention it is now possible to provide high density cards and boards, including prepreg based printed circuit boards, flexible circuit packages, and TAB packages, having copper surface circuitization on a polyimide substrate. These high density cards and boards are characterized by the presence of thin film gold regions. e.g. for bonding pads, on the copper circuitization, while reducing the adhesion loss of the copper circuitization to the polyimide substrate.

While the invention has been described with respect to one particular gold plating solution, it is to be understood that the addition of $NH_4^+$ to other gold plating solutions will likewise reduce loss of the Cu circuitization to the polyimide.

While the invention has been described with respect to certain preferred embodiments and exemplifications, it is not intended to limit the scope of the invention thereby, but solely by the claims appended hereto.

We claim:

1. In a method of fabricating a microelectronic package having gold plated copper circuitization on a dielectric substrate comprising forming copper surface circuitization on the dielectric substrate, and thereafter electrodepositing gold on the copper circuitization from an electroplating solution, the improvement where said electroplating solution comprising $KAu(CN)_2$, $K_2HPO_4$, and $KH_2PO_4$, and further (contains) containing an effective amount of ammonium ion to reduce adhesion loss between the copper circuitization and the substrate.

2. The method of claim 1 wherein the substrate is a polyimide substrate.

3. The method of claim 2 wherein the polyimide is poly (pyromellitic dianhydride-oxydianiline).

4. The method of claim 1 wherein the concentration of ammonium ion is an effective amount at least about 0.1 equivalent of $NH_4^+$ per liter.

5. The method of claim 4 wherein the concentration of ammonium ion is from about 0.1 equivalent per liter to about 1.0 equivalent per liter.

6. In a method of fabricating a microelectronic package having gold plated copper circuitization on a polyimide substrate comprising forming copper surface circuitization on the polyimide substrate, and thereafter electrodepositing gold on the copper circuitization from an electroplating solution comprising $KAu(CN)_2$, $K_2HPO_4$, and $KH_2PO_4$, the improvement where said electroplating solution further contains at least about 0.1 equivalent of $NH_4^+$ per liter to reduce adhesion loss between the copper circuitization and the substrate.

7. The method of claim 6 wherein the polyimide is poly (pyromellitic dianhydride-oxydianiline).

8. The method of claim 6 wherein the concentration of ammonium ion is from about 0.1 equivalent per liter to about 1.0 equivalent per liter.

9. In a method of fabricating a microelectronic package having gold plated copper circuitization on a polyimide substrate comprising forming copper surface circuitization on the polyimide substrate, and thereafter electrodepositing gold on the copper circuitization from an electroplating solution comprising about 20 grams/liter $KAu(CN)_2$, about 40 grams per liter $K_2HPO_4$, and about 10 grams per liter $KH_2PO_4$, the improvement where said electroplating solution contains at least about 0.1 equivalent of $NH_4^+$ per liter to reduce adhesion loss between the copper circuitization and the substrate.

10. The method of claim 9 wherein the polyimide is poly (pyromellitic dianhydride-oxydianiline).

11. The method of claim 9 wherein the concentration of ammonium ion is from about 0.1 equivalent per liter to about 1.0 equivalent per liter.

* * * * *